(12) United States Patent
Yang et al.

(10) Patent No.: US 10,817,024 B2
(45) Date of Patent: Oct. 27, 2020

(54) FLEXIBLE DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiaojian Yang, Beijing (CN); Xinbo Yu, Beijing (CN); Minghui Zhang, Beijing (CN); Inho Park, Beijing (CN); Weitao Chen, Beijing (CN)

(73) Assignees: BOE Technology Group Co., Ltd., Beijing (CN); Beijing BOE Display Technology Co., Ltd., Beijing (CN)

(*) Notice: Subject to any disclaimer, the term of this patent is extended or adjusted under 35 U.S.C. 154(b) by 0 days.

(21) Appl. No.: 16/461,133

(22) PCT Filed: Jun. 20, 2018

(86) PCT No.: PCT/CN2018/091936
§ 371 (c)(1),
(2) Date: May 15, 2019

(87) PCT Pub. No.: WO2019/001313
PCT Pub. Date: Jan. 3, 2019

(65) Prior Publication Data
US 2020/0073442 A1    Mar. 5, 2020

(30) Foreign Application Priority Data
Jun. 26, 2017  (CN) .................. 2017 1 0492705

(51) Int. Cl.
*G06F 1/16* (2006.01)
*G09F 9/30* (2006.01)
*H01L 51/00* (2006.01)

(52) U.S. Cl.
CPC ............ *G06F 1/1652* (2013.01); *G09F 9/301* (2013.01); *H01L 51/0097* (2013.01)

(58) Field of Classification Search
CPC ..... G06F 1/1652; G09F 9/301; H01L 51/0097
See application file for complete search history.

(56) References Cited

U.S. PATENT DOCUMENTS

| | | | |
|---|---|---|---|
| 2008/0291521 A1* | 11/2008 | Kim ................ | G02B 26/02 359/263 |
| 2013/0286462 A1* | 10/2013 | Yeo ................ | H01L 27/3244 359/291 |

(Continued)

FOREIGN PATENT DOCUMENTS

| CN | 204087714 U | 1/2015 |
|---|---|---|
| CN | 104459987 A | 3/2015 |

(Continued)

OTHER PUBLICATIONS

First Office Action for CN Appl. No. 201710492705.3, dated May 8, 2019.

(Continued)

*Primary Examiner* — Hoa C Nguyen
(74) *Attorney, Agent, or Firm* — The Webb Law Firm

(57) ABSTRACT

The present disclosure provides a flexible display device. The flexible display device comprises: a flexible base substrate, an electrodeformation layer set on the flexible base substrate, and a display layer set on the electrodeformation layer; wherein, the electrodeformation layer is configured to, when power is supplied, generate deformation, further cause the flexible base substrate and the display layer to generate corresponding deformation, cause the flexible display device to achieve flexible display, and when power is cut off, return to an original shape.

19 Claims, 6 Drawing Sheets

(56) References Cited

U.S. PATENT DOCUMENTS

2015/0091413 A1* 4/2015 Lee .................... H01L 27/20
                                                    310/328
2018/0266401 A1* 9/2018 van den Ende ....... H01L 41/042

FOREIGN PATENT DOCUMENTS

| CN | 104536187 A | 4/2015 |
| CN | 106875850 A | 6/2017 |
| CN | 107240600 A | 10/2017 |
| KR | 20100113869 A | 10/2010 |
| WO | WO-2016/043136 A1 | 3/2016 |

OTHER PUBLICATIONS

International Search Report and Written Opinion for International Appl. No. PCT/CN2018/091936, dated Sep. 27, 2018.
Notice of Allowance for CN Appl. No. 201710492705.3, dated Oct. 18, 2019.

* cited by examiner

FLEXIBLE DISPLAY DEVICE

CROSS-REFERENCE TO RELATED APPLICATIONS

This application is a U.S. National Stage under 35 U.S.C. § 371 of International Application No. PCT/CN2018/091936, filed on Jun. 20, 2018, which claims priority to China Patent Application No. 201710492705.3, filed on Jun. 26, 2017, and entitled "FLEXIBLE DISPLAY DEVICE". The disclosure of each application is incorporated by reference herein in entirety.

TECHNICAL FIELD

The present disclosure relates to a flexible display device.

BACKGROUND

With rapid development of a display technology, people have higher requirements for a display method, a display effect, etc, and concepts such as transparency, curved surface, flexibility and stretchability, etc, gradually become hot spots of research. Meanwhile, technical development of an Organic Light Emitted Diode (OLED) display has gradually become mature, which makes the above mentioned concepts come true gradually. Since screen pixel points themselves may emit light without backlight in the OLED technology, it is possible to achieve flexible stretchable display, as long as suitable substrate materials are found. As early as 2013, a research team developed such a flexible screen, it may not only bend, but also fold, twist, stretch, without being damaged, even it may be stretched to twice a size of a normal level, the screen is also still bright, and returns to the original size after it is released.

SUMMARY

According to some embodiments of the present disclosure, there is provided a flexible display device comprising: a flexible base substrate, an electrodeformation layer set on the flexible base substrate, and a display layer set on the electrodeformation layer. The electrodeformation layer is configured to: when power is supplied, generate deformation, further cause the flexible base substrate and the display layer to generate corresponding deformation, cause the flexible display device to achieve flexible display, and when power is cut off, return to an original shape.

According to some embodiments of the present disclosure, the electrodeformation layer includes a first sub-stretch layer. The first sub-stretch layer includes: multiple strip-shaped first electrodes extending in a first direction, as well as multiple strip-shaped first stretch parts extending in a second direction, wherein the second direction and the first direction intersect, the first stretch parts and the first electrodes are connected electrically in overlapping regions. When first voltages with opposite polarities are applied to two adjacent first electrodes, the first stretch parts of the first sub-stretch layer stretch in the second direction.

According to some embodiments of the present disclosure, each of the first stretch parts is provided with a first partition part in a region in which it overlaps at least one of the first electrodes, wherein, a width of the first partition part in the first direction is equal to a width of a corresponding first stretch part in the first direction, a width of the first partition part in the second direction is less than a width of a corresponding first electrode in the second direction.

According to some embodiments of the present disclosure, the electrodeformation layer further includes: a second sub-stretch layer set at one side of the first sub-stretch layer which faces the display layer, as well as a first insulation protection layer set between the second sub-stretch layer and the first sub-stretch layer. The second sub-stretch layer includes: multiple strip-shaped second electrodes extending in the second direction, as well as multiple strip-shaped second stretch parts extending in the first direction, wherein the second stretch parts and the second electrodes are connected electrically in overlapping regions. when second voltages with opposite polarities are applied to two adjacent second electrodes, the second stretch parts of the second sub-stretch layer stretch in the first direction.

According to some embodiments of the present disclosure, each of the second stretch parts is provided with a second partition part in a region in which it overlaps at least one of the second electrodes, wherein, a width of the second partition part in the second direction is equal to a width of a corresponding second stretch part in the second direction, a width of the second partition part in the first direction is less than a width of a corresponding second electrode in the first direction.

According to some embodiments of the present disclosure, materials of the first stretch parts and the second stretch parts are electrostrictive materials.

According to some embodiments of the present disclosure, the electrodeformation layer further includes: a sub-bending layer set on the base substrate and contacting the base substrate. The sub-bending layer includes: two strip-shaped third electrodes extending in a third direction, as well as at least one strip-shaped bending strip attached onto the base substrate and extending in a fourth direction, the fourth direction and the third direction intersect, the bending strip and the third electrodes are connected electrically in overlapping regions. when third voltages with opposite polarities are applied to the two third electrodes, the bending strip of the sub-bending layer bends at a preset curvature.

According to some embodiments of the present disclosure, the first sub-stretch layer is located above the sub-bending layer, there is also a second insulation protection layer set between the sub-bending layer and the first sub-stretch layer.

According to some embodiments of the present disclosure, the first sub-stretch layer and the sub-bending layer are set in a same layer, the third direction and the first direction are the same, the fourth direction and the second direction are the same. the flexible display device includes a display region as well as a non-display region surrounding the display region, both the first electrodes and the first stretch parts are located within the display region, both the third electrodes and the bending strip are located in the non-display region, and two third electrodes are located at two opposite sides of the non-display region, respectively.

According to some embodiments of the present disclosure, the bending strip is a TiNi memory alloy strip.

According to some embodiments of the present disclosure, the flexible display device further includes: first electrode leads in a one-to-one corresponding connection with each first electrode; and a control part connected with the first electrode leads. The control part is configured to apply the first voltages with opposite polarities to two adjacent first electrodes via the first electrode leads.

According to some embodiments of the present disclosure, the flexible display device further includes: first electrode leads in a one-to-one corresponding connection with each first electrode; second electrode leads in a one-to-one corresponding connection with each second electrode; and a control part connected with the first electrode leads and the second electrode leads. The control part is configured to apply the first voltages with opposite polarities to two adjacent first electrodes via the first electrode leads and apply the second voltages with opposite polarities to two adjacent second electrodes via the second electrode leads.

According to some embodiments of the present disclosure, the flexible display device further includes: first electrode leads in a one-to-one corresponding connection with each first electrode; second electrode leads in a one-to-one corresponding connection with each second electrode; third electrode leads in a one-to-one corresponding connection with each third electrode; and a control part connected with the first electrode leads, the second electrode leads and the third electrode leads. The control part is configured to, apply the first voltages with opposite polarities to two adjacent first electrodes via the first electrode leads, apply the second voltages with opposite polarities to two adjacent second electrodes via the second electrode leads, and apply the third voltages with opposite polarities to two adjacent third electrodes via the third electrode leads.

DETAILED DESCRIPTION

Figure 1:
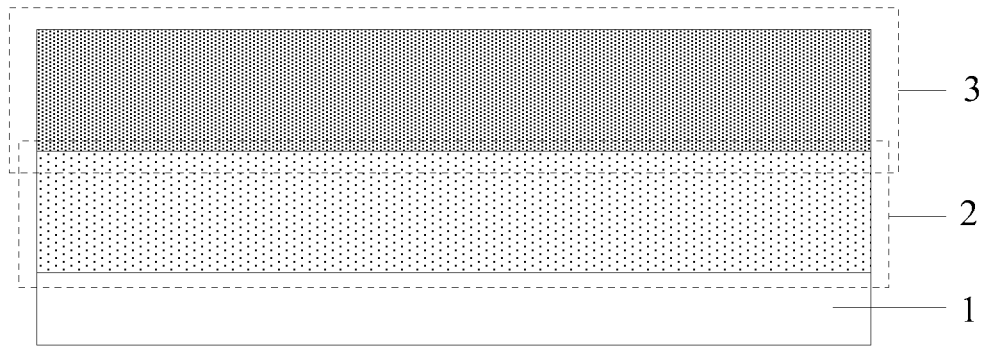
FIG. 1 is a structural diagram of a flexible display device provided according to some embodiments of the present disclosure.

Hereinafter, in conjunction with drawings of the specification, implementations of some embodiments of the present disclosure are explained in detail. It is noted that, the same or similar reference numerals denote the same or similar elements or elements that have substantially the same or similar function throughout. Embodiments described below with reference to the drawings are exemplary, are for the purpose of explaining the present disclosure only, and can not be understood to limit the present disclosure.

In the relevant art, when a flexible display device performs flexible display, it needs to depend on forces applied from the outside to stretch or bend, it can not achieve a function of automatic flexible display, and the flexible display in this way has problems in which the display effect is not good due to forces applied non-uniformly as well as the use is not convenient due to the display device returning to an original shape after the stretch because of existence of a stress.

A flexible display device provided by the present disclosure can achieve at least one of the following technical effects: automatic flexible display of the flexible display device, optimization of the display effect of the flexible display device, or improvement of inconvenient use of the flexible display device.

FIG. 1 is a structural diagram of a flexible display device provided according to some embodiments of the present disclosure. With reference to FIG. 1, the flexible display device includes: a flexible base substrate 1, an electrodeformation layer 2 set on the flexible base substrate 1, and a display layer 3 set on the electrodeformation layer 2.

The electrodeformation layer 2 is configured to, when power is supplied, generate deformation, further cause the flexible base substrate 1 and the display layer 3 to generate corresponding deformation, cause the flexible display device to achieve flexible display, and when power is cut off, return to an original shape.

Figure 2:
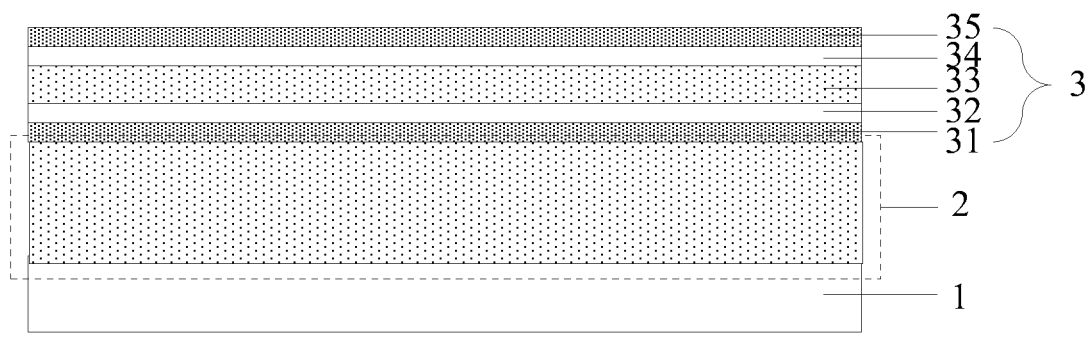
FIG. 2 is a structural diagram of a flexible display device, in which a display layer is a multilayer composite layer, provided according to some embodiments of the present disclosure.

FIG. 2 is a structural diagram of a flexible display device, in which a display layer is a multilayer composite layer, provided according to some embodiments of the present disclosure. In some embodiments of the present disclosure, the display layer 3 may be a composite layer including multiple film layers, for example, as shown in FIG. 2, the display layer 3 may be a composite layer which includes an anode layer 31, a hole transport layer 32, a light emmitting layer 33, an electron transport layer 34, a cathode layer 35, etc, in order.

In some embodiments of the present disclosure, the electrodeformation layer 2 may also be a composite layer including multiple film layers.

Figure 3:
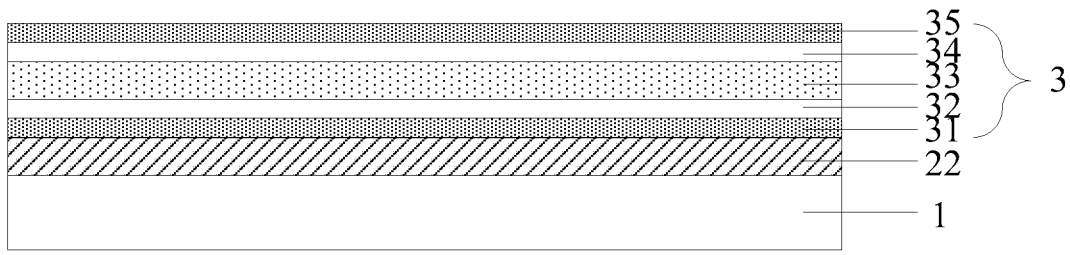
FIG. 3 is a sectional structural diagram of a flexible display device provided according to some embodiments of the present disclosure.

FIG. 3 is a sectional structural diagram of a flexible display device provided according to some embodiments of the present disclosure. As shown in FIG. 3, the electrodeformation layer 2 includes a first sub-stretch layer 22.

Figure 4:
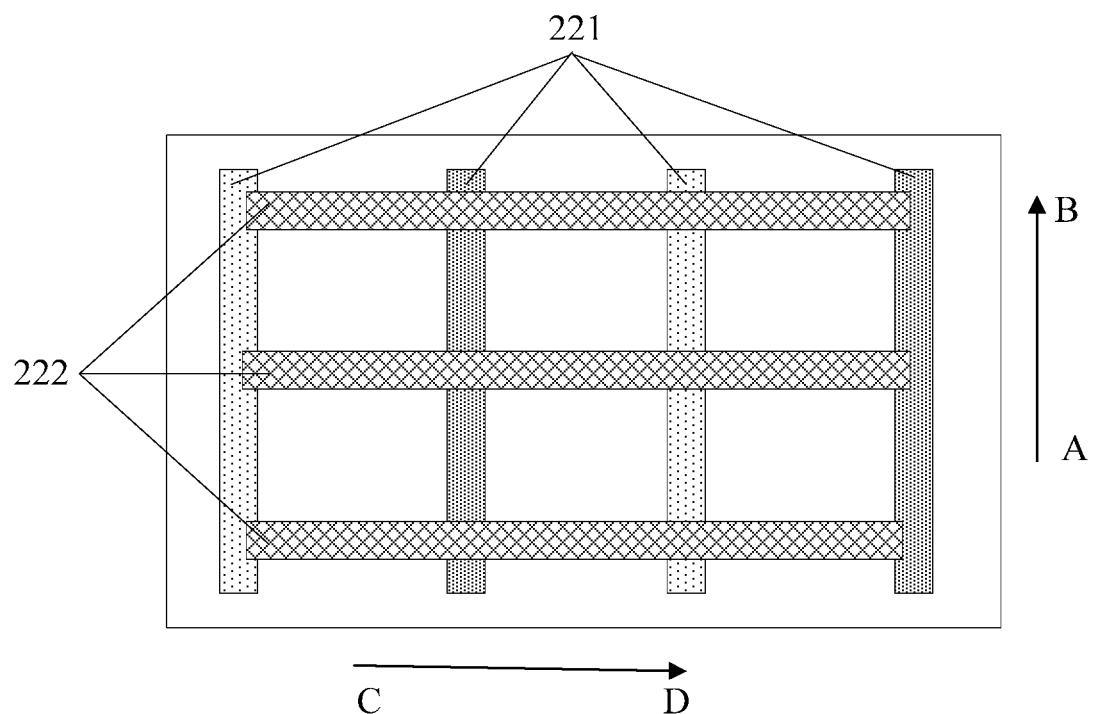
FIG. 4 is a top structural diagram of a flexible display device provided according to some embodiments of the present disclosure.

FIG. 4 is a top structural diagram of a flexible display device provided according to some embodiments of the present disclosure. As shown in FIG. 4, the first sub-stretch layer 22 includes: multiple strip-shaped first electrodes 221 extending in a first direction AB, as well as multiple strip-shaped first stretch parts 222 extending in a second direction CD. The second direction CD and the first direction AB intersect. In some embodiments, the second direction CD is substantially perpendicular or perpendicular to the first direction AB. The first stretch parts 222 and the first electrodes 221 are connected electrically in overlapping regions. When first voltages with opposite polarities are applied to two adjacent first electrodes 221, the first stretch parts 222 of the first sub-stretch layer 22 stretch in the second direction CD, further cause the electrodeformation layer 2 to be able to stretch in the second direction CD, and cause the whole flexible display device to stretch in the second direction CD.

Figure 5:
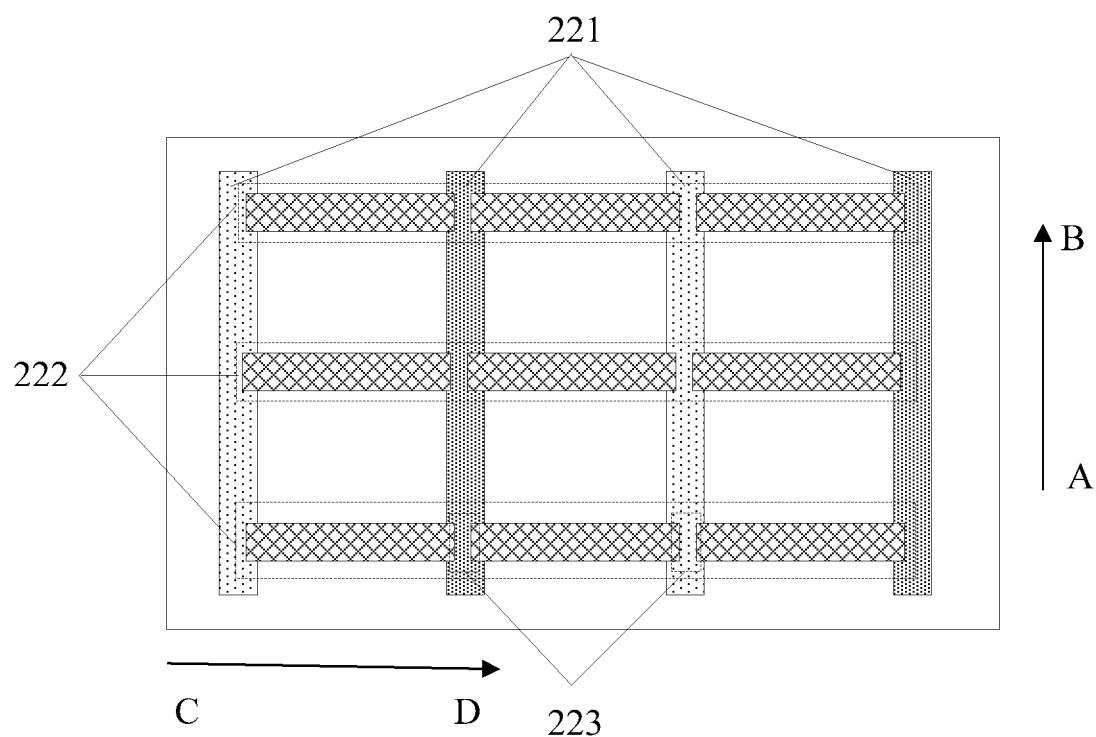
FIG. 5 is a top structural diagram of a flexible display device provided according to some other embodiments of the present disclosure.

In some embodiments, each of the first stretch parts 222 may be a monolithic structure, for example, as shown in FIG. 4. In some other embodiments, each of the first stretch parts 222 may also be a discrete structure composed of multiple sub-first stretch parts which are spaced apart. For example, as shown in FIG. 5, each of the first stretch parts 222 is provided with a corresponding first partition part 223 in a region in which it overlaps each of the first electrodes 221, wherein, a width of each of the first partition parts 223 in the first direction AB is equal to a width of the first stretch part 222 in the first direction AB, a width of each of the first partition parts 223 in the second direction CD is less than a width of a corresponding first electrode 221 in the second direction CD. Each of the first stretch parts 222 being provided with the corresponding first partition part 223 in the region in which it overlaps the first electrode may mitigate a problem in which a whole strip of the first stretch part has a not good stretch effect due to existence of a large internal stress.

While FIG. 5 illustrates that the corresponding first partition part 223 is provided in each overlapping region of each of the first stretch parts 222 and each of the first electrodes 221, those skilled in the art may understand that, various modifications are all within a scope of the present disclosure. For example, it is possible to provide the first partition part 223 in each of overlapping regions of each of the first stretch parts 222 and a selected first electrode(s) 221 (e.g., a 2nd, 4th, 6th first electrode, or every several first electrodes).

Figure 6:
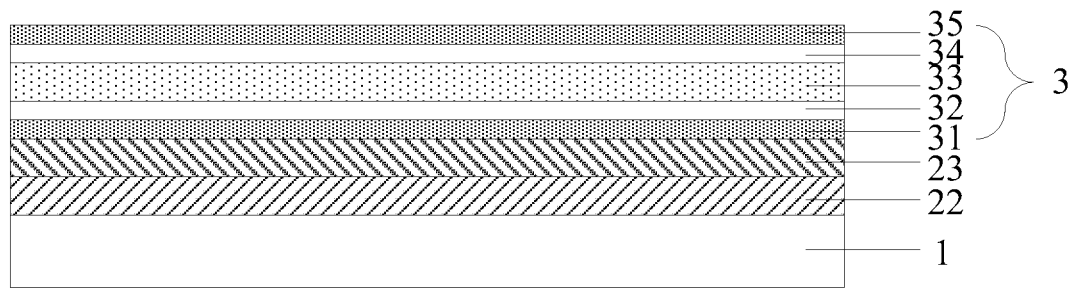
FIG. 6 is a sectional structural diagram of a flexible display device provided according to some embodiments of the present disclosure.

FIG. 6 is a sectional structural diagram of a flexible display device provided according to some embodiments of the present disclosure. As shown in FIG. 6, the electrode-formation layer 2 may also include: a second sub-stretch layer 23 set at one side of the first sub-stretch layer 22 which faces the display layer 3, as well as a first insulation protection layer set between the second sub-stretch layer 23 and the first sub-stretch layer 22 (not shown in the Figure).

Figure 7:
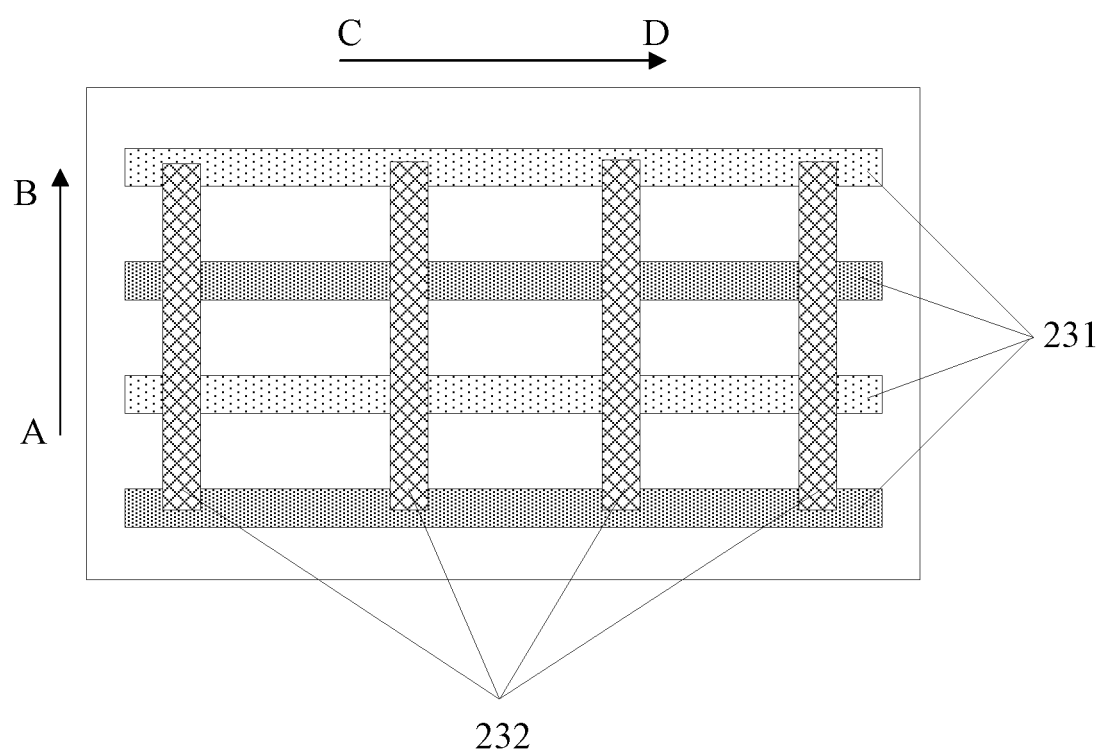
FIG. 7 is a top structural diagram of a flexible display device provided according to some embodiments of the present disclosure.

FIG. 7 is a top structural diagram of a flexible display device provided according to some embodiments of the present disclosure. As shown in FIG. 7, the second sub-stretch layer 23 includes: multiple strip-shaped second electrodes 231 extending in the second direction CD, as well as multiple strip-shaped second stretch parts 232 extending in the first direction AB. The second stretch parts 232 and the second electrodes 231 are connected electrically in overlapping regions. When second voltages with opposite polarities are applied to two adjacent second electrodes 231, the second stretch parts 232 of the second sub-stretch layer 23 stretch in the first direction AB, further cause the electrodeformation layer 2 to be able to stretch in the first direction AB, and cause the whole flexible display device to stretch in the first direction AB.

Figure 8:
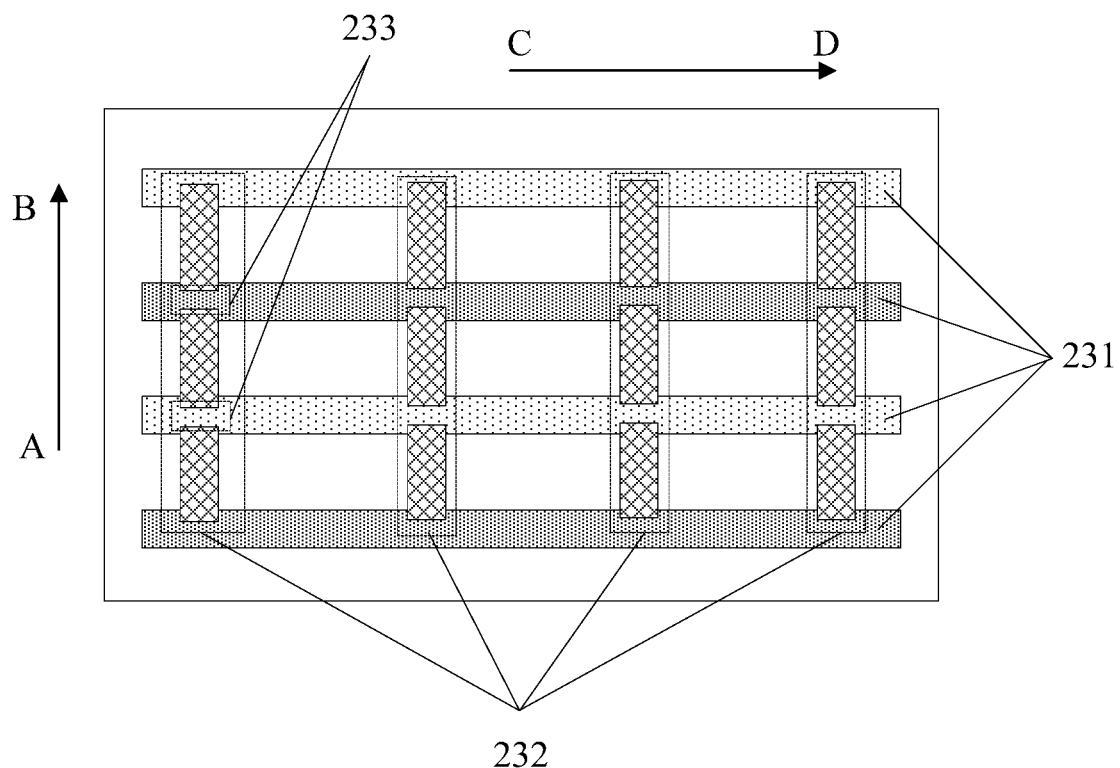
FIG. 8 is a top structural diagram of a flexible display device provided according to some other embodiments of the present disclosure.

In some embodiments, each of the second stretch parts 232 may be a monolithic structure, for example, as shown in FIG. 7. In some other embodiments, each of the second stretch parts 232 may also be a discrete structure composed of multiple sub-second stretch parts which are spaced apart. For example, as shown in FIG. 8, each of the second stretch parts 232 is provided with a corresponding second partition part 223 in a region in which it overlaps each of the second electrodes 231. A width of the second partition part 233 in the second direction CD is equal to a width of a corresponding second stretch part 232 in the second direction CD, a width of the second partition part 233 in the first direction AB is less than a width of a corresponding second electrode 231 in the first direction AB. Each of the second stretch parts 232 being provided with the corresponding second partition part 233 in the region in which it overlaps the second electrode 231 may mitigate a problem in which a whole strip of the second stretch part has a not good stretch effect due to existence of a large internal stress.

While FIG. 8 illustrates that a corresponding second partition part 233 is provided in each overlapping region of each of the second stretch parts 232 and each of the second electrodes 231, those skilled in the art may understand that, various modifications are all within a scope of the present disclosure. For example, it is possible to provide a second partition part 233 in each of overlapping regions of each of the second stretch parts 232 and a selected second electrode (s) 231 (e.g., a 2nd, 4th, 6th second electrode 231, or every several second electrodes 231).

It is to be noted that, materials of the first stretch part 222 and the second stretch part 232 may be electrostrictive materials. In at least one embodiment, the first electrodes 221 are equidistantly uniformly arranged, the first stretch parts 222 are equidistantly uniformly arranged. In at least one embodiment, the second electrodes 231 are equidistantly uniformly arranged, the second stretch parts 232 are equidistantly uniformly arranged. In some embodiments, the first direction may be transverse, the second direction may be longitudinal. In some other embodiments, the first direction may be transverse, the second direction may be longitudinal.

Figure 9:
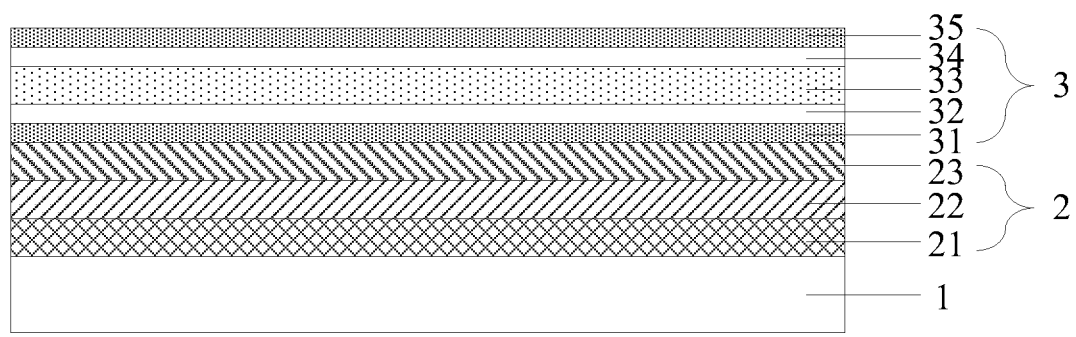
FIG. 9 is a sectional structural diagram of a flexible display device provided according to some embodiments of the present disclosure.

FIG. 9 is a sectional structural diagram of a flexible display device provided according to some embodiments of the present disclosure. As shown in FIG. 9, the electrode-formation layer 2 may also include: a sub-bending layer 21 set on the base substrate 1 and contacting the base substrate 1.

Figure 10:
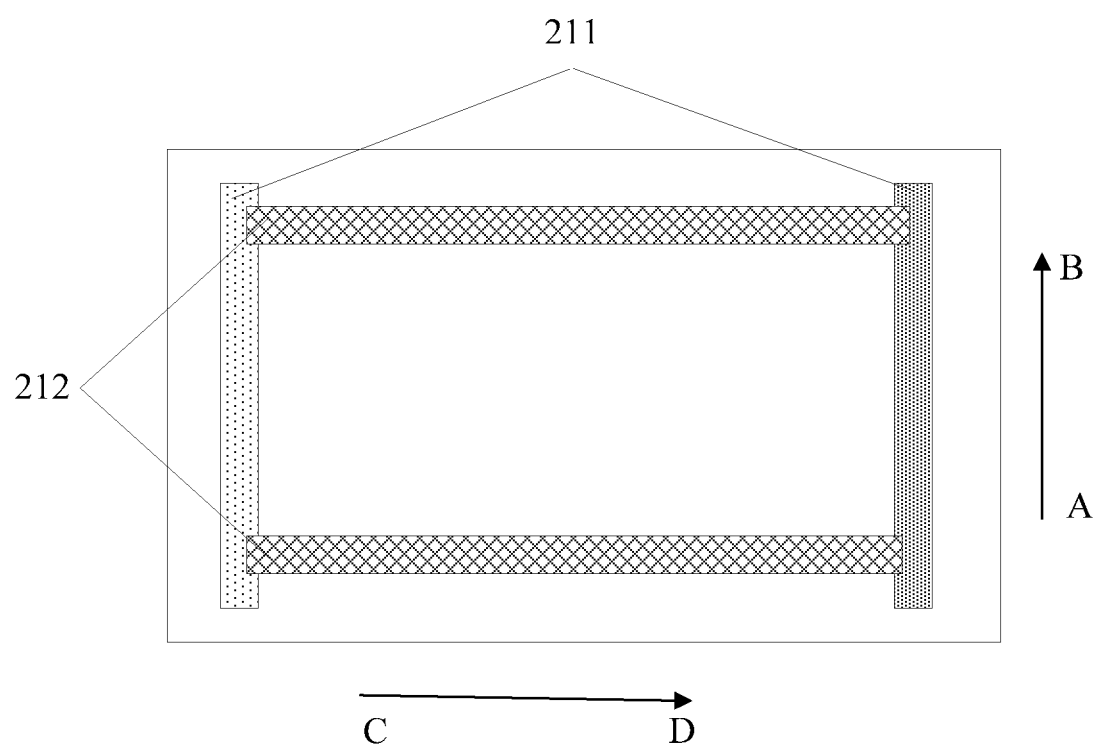
FIG. 10 is a top structural diagram of a flexible display device provided according to some embodiments of the present disclosure.

FIG. 10 is a top structural diagram of a flexible display device provided according to some embodiments of the present disclosure. As shown in FIG. 10, the sub-bending layer 21 includes: two strip-shaped third electrodes 211 extending in a third direction, as well as at least one strip-shaped bending strip 212 attached onto the base substrate 1 and extending in a fourth direction. The fourth direction and the third direction intersect. In some embodiments, the fourth direction is substantially perpendicular or perpendicular to the third direction. The bending strip 212 and the third electrodes 211 are connected electrically in overlapping regions. When third voltages with opposite polarities are applied to the two third electrodes 211, the bending strip 212 bends at a preset curvature.

In some embodiments, the sub-bending layer 21 and the first sub-stretch layer 22 may be located in different layers. For example, as shown in FIG. 9, the first sub-stretch layer 22 may be located above the sub-bending layer 21, there may also be a second insulation protection layer set between the sub-bending layer 21 and the first sub-stretch layer 22 (not shown in the Figure).

Figure 11:
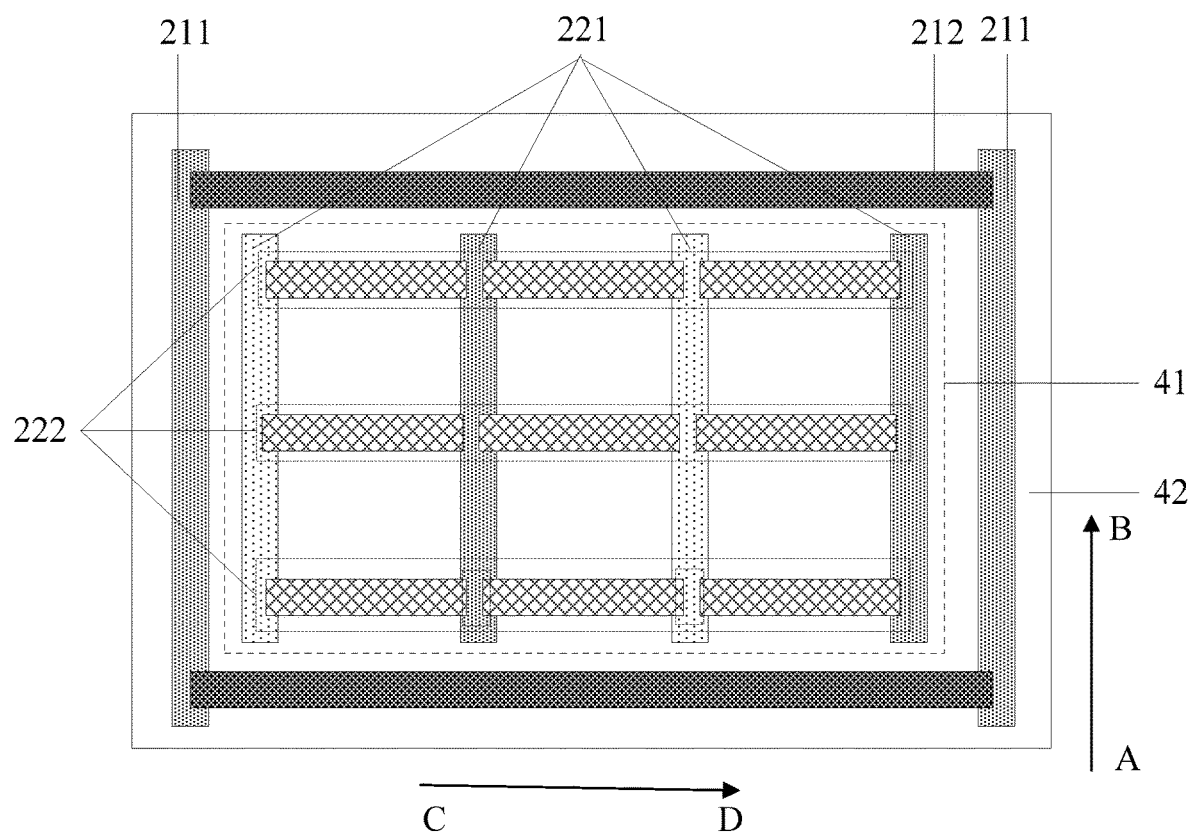
FIG. 11 is a top structural diagram of a flexible display device provided according to some other embodiments of the present disclosure.

In some other embodiments, the sub-bending layer 21 and the first sub-stretch layer 22 may be located in a same layer. For example, as shown in FIG. 11, the first sub-stretch layer 22 and the sub-bending layer 21 are set in the same layer. The third direction and the first direction are the same, the fourth direction and the second direction are the same. The flexible display device includes a display region 41 as well as a non-display region 42 surrounding the display region 41, wherein both the first electrodes 221 and the first stretch parts 222 are located within the display region 41, both the third electrodes 211 and the bending strips 212 are located in the non-display region 42, and two third electrodes 211 are set at two opposite sides of the non-display region 41, respectively. When the sub-bending layer 21 and the first sub-stretch layer 22 are set in the same layer, it is possible to thin a structure of the display device, and use one process to simultaneously form the first electrodes 221 and the third electrodes 211. Moreover, in view of memory alloys in the relevant art generally having not good stretchability, setting the first electrodes 221 and the first stretch parts 222 in the display region 41 and setting the third electrodes 211 and the bending strips 212 in the non-display region 42, may prevent the bending strips 212 from influencing a stretch effect of the display region 41.

It is to be noted that, the bending strips in some embodiments of the present disclosure may adopt Shape Memory Alloys (SMA), SMA is an alloy material which, after heated and warmed, can completely eliminate deformation thereof occurred at a low temperature and return to its original shape before the deformation, i.e. an alloy possessing a "memory" effect. In some embodiments of the present disclosure, as the memory alloy, a material which has a double layer memory effect is selected, and in an original state, it has a shape with a certain curvature, and at a lower temperature (for instance: below 40° C.), the material is straight, and after power is supplied and the material is heated (such as up to 60° C.), the material will become a curved surface, and after power is cut off and the material is cooled, the material becomes straight again, and according to such a principle, it is possible to achieve control of a curved surface of the display panel. In at least one embodiment, the material of the bending strip is a TiNi memory alloy, the memory effect thereof is excellent, the performance is stable.

In addition, the flexible display device of some embodiments of the present disclosure may also include first electrode leads in a one-to-one corresponding connection with each first electrode, second electrode leads in a one-to-one corresponding connection with the second electrodes, as well as third electrode leads in a one-to-one corresponding connection with each third electrode, as well as it may also set a control component which drives the electrodeformation layer. The control component may be connected with the first electrode leads, the second electrode leads and/or the third electrode leads, and may transmit different control signals to the electrodeformation layer to apply preset voltages with opposite polarities to two adjacent first electrodes, two adjacent second electrodes and/or two adjacent third electrodes, so that electric fields may be formed between adjacent electrodes, so that the first stretch parts, the second stretch parts and/or the bending strips stretch and/or bend under the action of the electric fields, so that the electrodeformation layer deforms.

For example, in some embodiments, the flexible display device further includes: first electrode leads in a one-to-one corresponding connection with each first electrode; and a control part connected with the first electrode leads. The control part is configured to apply the first voltages with opposite polarities to two adjacent first electrodes via the first electrode leads.

In some other embodiments, the flexible display device further includes: first electrode leads in a one-to-one corresponding connection with each first electrode; second electrode leads in a one-to-one corresponding connection with each second electrode; and a control part connected with the first electrode leads and the second electrode leads. The control part is configured to apply the first voltages with opposite polarities to two adjacent first electrodes via the first electrode leads and apply the second voltages with opposite polarities to two adjacent second electrodes via the second electrode leads.

In some other embodiments, the flexible display device further includes: first electrode leads in a one-to-one corresponding connection with each first electrode; second electrode leads in a one-to-one corresponding connection with each second electrode; third electrode leads in a one-to-one corresponding connection with each third electrode; and a control part connected with the first electrode leads, the second electrode leads and the third electrode leads. The control part is configured to, apply the first voltages with opposite polarities to two adjacent first electrodes via the first electrode leads, apply the second voltages with opposite polarities to two adjacent second electrodes via the second electrode leads, and apply the third voltages with opposite polarities to two adjacent third electrodes via the third electrode leads.

In the flexible display device provided by some embodiments of the present disclosure, the electrodeformation layer is set between the flexible base substrate and the display layer, the electrodeformation layer may generate deformation when power is supplied, further cause the flexible base substrate and the display layer to generate corresponding deformation, cause the flexible display device to be able to achieve automatic flexible display, it is not necessary to achieve flexible display by external forces applied from the outside, moreover, the automatic flexible display achieved by the flexible display device itself setting the electrodeformation layer may mitigate the problem in which, when the flexible display device in the relevant art achieves flexible display by the forces applied from the outside, the flexible display effect is not good due to the forces applied non-uniformly, as well as the use is not convenient due to the display device being prone to return to an original state.

Obviously, those skilled in the art may make various changes and modifications to the present disclosure without departing from the spirit and the scope of the present disclosure. Thus, if these changes and modifications to the present disclosure are within the scope of claims of the present disclosure and equivalent technology, the present disclosure is also intended to cover these changes and modifications.

What is claimed is:

1. A flexible display device comprising:
   a flexible base substrate,
   an electrodeformation layer set on the flexible base substrate, and
   a display layer set on the electrodeformation layer;
   wherein the electrodeformation layer is configured to:
      when power is supplied, generate deformation, further cause the flexible base substrate and the display layer to generate corresponding deformation, cause the flexible display device to achieve flexible display, and
      when power is cut off, return to an original shape,
   wherein the electrodeformation layer includes a first sub-stretch layer; wherein the first sub-stretch layer includes: multiple strip-shaped first electrodes extending in a first direction, as well as multiple strip-shaped first stretch parts extending in a second direction, wherein the second direction and the first direction intersect, the first stretch parts and the first electrodes are connected electrically in overlapping regions;
   wherein when first voltages with opposite polarities are applied to two adjacent first electrodes, the first stretch parts of the first sub-stretch layer stretch in the second direction.

2. The flexible display device according to claim 1, wherein a first partition part is set in the overlapping region of each of the first stretch parts and at least one of the first electrodes, wherein, a width of the first partition part in the first direction is equal to a width of a corresponding first stretch part in the first direction, a width of the first partition part in the second direction is less than a width of a corresponding first electrode in the second direction.

3. The flexible display device according to claim 2, wherein the electrodeformation layer further includes: a sub-bending layer set on the flexible base substrate and contacting the flexible base substrate;
   wherein the sub-bending layer includes: two strip-shaped third electrodes extending in a third direction, as well as at least one strip-shaped bending strip attached onto the flexible base substrate and extending in a fourth direction, the fourth direction and the third direction intersect, the bending strip and the third electrodes are connected electrically in overlapping regions;
   when third voltages with opposite polarities are applied to the two third electrodes, the bending strip of the sub-bending layer bends at a preset curvature.

4. The flexible display device according to claim 2, further comprising:
   first electrode leads in a one-to-one corresponding connection with each first electrode; and
   a control part connected with the first electrode leads, configured to apply the first voltages with opposite polarities to two adjacent first electrodes via the first electrode leads.

5. The flexible display device according to claim 1, wherein the electrodeformation layer further includes: a second sub-stretch layer set at one side of the first sub-stretch layer which faces the display layer, as well as a first insulation protection layer set between the second sub-stretch layer and the first sub-stretch layer;
   wherein the second sub-stretch layer includes: multiple strip-shaped second electrodes extending in the second direction, as well as multiple strip-shaped second stretch parts extending in the first direction, wherein the second stretch parts and the second electrodes are connected electrically in overlapping regions;
   wherein when second voltages with opposite polarities are applied to two adjacent second electrodes, the second stretch parts of the second sub-stretch layer stretch in the first direction.

6. The flexible display device according to claim 5, wherein each of the second stretch parts is provided with a second partition part in a region in which it overlaps at least one of the second electrodes, wherein, a width of the second partition part in the second direction is equal to a width of a corresponding second stretch part in the second direction, a width of the second partition part in the first direction is less than a width of a corresponding second electrode in the first direction.

7. The flexible display device according to claim 6, wherein the electrodeformation layer further includes: a sub-bending layer set on the flexible base substrate and contacting the flexible base substrate;
   wherein the sub-bending layer includes: two strip-shaped third electrodes extending in a third direction, as well as at least one strip-shaped bending strip attached onto the flexible base substrate and extending in a fourth direction, the fourth direction and the third direction intersect, the bending strip and the third electrodes are connected electrically in overlapping regions;
   wherein when third voltages with opposite polarities are applied to the two third electrodes, the bending strip of the sub-bending layer bends at a preset curvature.

8. The flexible display device according to claim 5, wherein materials of the first stretch parts and the second stretch parts are electrostrictive materials.

9. The flexible display device according to claim 8, wherein the electrodeformation layer further includes: a sub-bending layer set on the flexible base substrate and contacting the flexible base substrate;
   wherein the sub-bending layer includes: two strip-shaped third electrodes extending in a third direction, as well as at least one strip-shaped bending strip attached onto the flexible base substrate and extending in a fourth direction, the fourth direction and the third direction intersect, the bending strip and the third electrodes are connected electrically in overlapping regions;
   wherein when third voltages with opposite polarities are applied to the two third electrodes, the bending strip of the sub-bending layer bends at a preset curvature.

10. The flexible display device according to claim 5, further comprising:
    first electrode leads in a one-to-one corresponding connection with each first electrode;
    second electrode leads in a one-to-one corresponding connection with each second electrode; and
    a control part connected with the first electrode leads and the second electrode leads, configured to apply the first voltages with opposite polarities to two adjacent first electrodes via the first electrode leads and apply the second voltages with opposite polarities to two adjacent second electrodes via the second electrode leads.

11. The flexible display device according to claim 5, wherein the electrodeformation layer further includes: a sub-bending layer set on the flexible base substrate and contacting the flexible base substrate;
    wherein the sub-bending layer includes: two strip-shaped third electrodes extending in a third direction, as well as at least one strip-shaped bending strip attached onto the flexible base substrate and extending in a fourth direction, the fourth direction and the third direction intersect, the bending strip and the third electrodes are connected electrically in overlapping regions;
    wherein when third voltages with opposite polarities are applied to the two third electrodes, the bending strip of the sub-bending layer bends at a preset curvature.

12. The flexible display device according to claim 1, wherein the electrodeformation layer further includes: a sub-bending layer set on the flexible base substrate and contacting the flexible base substrate;
    wherein the sub-bending layer includes: two strip-shaped third electrodes extending in a third direction, as well as at least one strip-shaped bending strip attached onto the flexible base substrate and extending in a fourth direction, the fourth direction and the third direction intersect, the bending strip and the third electrodes are connected electrically in overlapping regions;
    wherein when third voltages with opposite polarities are applied to the two third electrodes, the bending strip of the sub-bending layer bends at a preset curvature.

13. The flexible display device according to claim 12, wherein the first sub-stretch layer is located above the sub-bending layer, there is also a second insulation protection layer set between the sub-bending layer and the first sub-stretch layer.

14. The flexible display device according to claim 13, further comprising:
    first electrode leads in a one-to-one corresponding connection with each first electrode;

second electrode leads in a one-to-one corresponding connection with each second electrode;

third electrode leads in a one-to-one corresponding connection with each third electrode; and a control part connected with the first electrode leads, the second electrode leads and the third electrode leads, configured to, apply the first voltages with opposite polarities to two adjacent first electrodes via the first electrode leads, apply the second voltages with opposite polarities to two adjacent second electrodes via the second electrode leads, and apply the third voltages with opposite polarities to two adjacent third electrodes via the third electrode leads.

15. The flexible display device according to claim 12, wherein the first sub-stretch layer and the sub-bending layer are set in a same layer, the third direction and the first direction are the same, the fourth direction and the second direction are the same;

wherein the flexible display device includes a display region as well as a non-display region surrounding the display region, both the first electrodes and the first stretch parts are located within the display region, both the third electrodes and the bending strip are located in the non-display region, and two third electrodes are located at two opposite sides of the non-display region, respectively.

16. The flexible display device according to claim 15, further comprising:

first electrode leads in a one-to-one corresponding connection with each first electrode;

second electrode leads in a one-to-one corresponding connection with each second electrode;

third electrode leads in a one-to-one corresponding connection with each third electrode; and a control part connected with the first electrode leads, the second electrode leads and the third electrode leads, configured to, apply the first voltages with opposite polarities to two adjacent first electrodes via the first electrode leads, apply the second voltages with opposite polarities to two adjacent second electrodes via the second electrode leads, and apply the third voltages with opposite polarities to two adjacent third electrodes via the third electrode leads.

17. The flexible display device according to claim 12, wherein the bending strip is a TiNi memory alloy strip.

18. The flexible display device according to claim 12, further comprising:

first electrode leads in a one-to-one corresponding connection with each first electrode;

second electrode leads in a one-to-one corresponding connection with each second electrode;

third electrode leads in a one-to-one corresponding connection with each third electrode; and a control part connected with the first electrode leads, the second electrode leads and the third electrode leads, configured to, apply the first voltages with opposite polarities to two adjacent first electrodes via the first electrode leads, apply the second voltages with opposite polarities to two adjacent second electrodes via the second electrode leads, and apply the third voltages with opposite polarities to two adjacent third electrodes via the third electrode leads.

19. The flexible display device according to claim 1, further comprising:

first electrode leads in a one-to-one corresponding connection with each first electrode; and a control part connected with the first electrode leads, configured to apply the first voltages with opposite polarities to two adjacent first electrodes via the first electrode leads.

* * * * *